United States Patent
Tanwar

(10) Patent No.: US 9,558,997 B2
(45) Date of Patent: Jan. 31, 2017

(54) INTEGRATION OF RU WET ETCH AND CMP FOR BEOL INTERCONNECTS WITH RU LAYER

(71) Applicant: GLOBALFOUNDRIES Inc., Grand Cayman (KY)

(72) Inventor: Kunaljeet Tanwar, Slingerlands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 37 days.

(21) Appl. No.: 13/729,180

(22) Filed: Dec. 28, 2012

(65) Prior Publication Data
US 2014/0187036 A1    Jul. 3, 2014

(51) Int. Cl.
*H01L 21/768* (2006.01)
*H01L 21/3213* (2006.01)

(52) U.S. Cl.
CPC ... *H01L 21/76865* (2013.01); *H01L 21/32134* (2013.01); *H01L 21/7684* (2013.01); *H01L 21/76831* (2013.01); *H01L 21/76843* (2013.01)

(58) Field of Classification Search
CPC .............. H01L 27/10814; H01L 28/60; H01L 21/7684; H01L 21/76831; H01L 21/76843; H01L 21/76865

USPC ......................................... 438/640, 645, 626
See application file for complete search history.

(56) References Cited

U.S. PATENT DOCUMENTS

| | | | |
|---|---|---|---|
| 5,604,156 A * | 2/1997 | Chung | H01L 21/76807 257/E21.579 |
| 7,799,674 B2 * | 9/2010 | Shinriki et al. | 438/627 |
| 7,851,360 B2 * | 12/2010 | Dominguez et al. | 438/681 |
| 8,247,030 B2 * | 8/2012 | Suzuki et al. | 427/250 |
| 2006/0189133 A1 * | 8/2006 | Dimitrakopoulos et al. | 438/687 |
| 2006/0211228 A1 * | 9/2006 | Matsuda | 438/575 |
| 2007/0054487 A1 * | 3/2007 | Ma et al. | 438/681 |
| 2008/0299772 A1 * | 12/2008 | Yoon | H01L 21/28556 438/687 |
| 2010/0015798 A1 * | 1/2010 | Suzuki | C23C 16/02 438/653 |
| 2010/0242631 A1 * | 9/2010 | Hetzer | G01N 1/02 73/863.21 |
| 2012/0012372 A1 * | 1/2012 | McFeely et al. | 174/257 |
| 2012/0196052 A1 * | 8/2012 | Ishizaka et al. | 427/576 |
| 2014/0065815 A1 * | 3/2014 | Tanwar | 438/627 |

* cited by examiner

*Primary Examiner* — Amar Movva
(74) *Attorney, Agent, or Firm* — Williams Morgan, P.C.

(57) ABSTRACT

Embodiments described herein provide approaches for interconnect formation in a semiconductor device. Specifically, a Cu layer is removed to a top surface of an Ru layer using CMP, the Cu layer is removed to form a recess within each of a plurality of trenches of a dielectric of the semiconductor device, and the Ru layer is removed using an etch process (e.g., a wet etch). An additional CMP is performed to reach the desired target trench height and to planarize the wafer.

20 Claims, 13 Drawing Sheets

INTEGRATION OF RU WET ETCH AND CMP FOR BEOL INTERCONNECTS WITH RU LAYER

BACKGROUND

Technical Field

This invention relates generally to the field of semiconductors, and more particularly, to manufacturing approaches used in interconnect formation for integrated circuits and other devices.

Related Art

The semiconductor manufacturing process typically includes two major components, namely the Front-End-of-Line (FEOL), which includes the multilayer process of forming semiconductor devices (transistors, etc.) on a semiconductor substrate, and the Back-End-Of-Line (BEOL), which includes the metallization after the semiconductor devices have been formed. Like all electronic devices, semiconductor devices in a microchip, such as an integrated circuit (IC), need to be electronically connected through wiring. In an integrated circuit, such wiring is done through multilayer metallization on top of the multilayered semiconductor devices formed on the semiconductor substrate. The complexity of this wiring becomes appreciable as there may be hundreds of millions or more semiconductor devices (e.g., transistors in particular) formed on a single IC. Proper connection of these devices is accomplished by multilayer metallization. Each metallization layer consists of a grid of metal lines sandwiched between one or more dielectric layers for electrical integrity. Modern semiconductor manufacturing processes can involve multiple metallization layers.

As scaling of microelectronic devices approaches sub 30 nm nodes, many material and module process challenges in BEOL patterning have been reported. In one conventional approach, a BEOL integration scheme uses chemical mechanical planarization (CMP) to remove ruthenium (Ru) layer(s). The prior art device of FIGS. 1-3 demonstrates this process. As shown in FIG. 1, a device 1 comprises a substrate 2, a capping layer 4 formed over substrate 2, a dielectric layer 6 formed over capping layer 4, a Tantalum (Ta)/Tantalum Nitride (TaN) layer 8 formed over dielectric layer 6, a Ruthenium (Ru) layer 10 formed over Ta/TaN layer 8, and a copper (Cu) layer 12 formed over Ru layer 10. As shown in FIG. 2, Cu layer 12 is removed using CMP. As shown in FIG. 3, Ru layer 10 is removed using CMP, along with Ta/TaN layer 8, Cu layer 12, and dielectric layer 6. However, Ru is difficult to remove using CMP due to its slow removal rate. Highly abrasive slurries need to be used to get appreciable CMP removal rate, which in turn result in high defects post-CMP (e.g., scratches, surface particles, etc.). Additionally, expensive post-CMP cleaning chemistries are required to clean the wafer after the CMP. As such, current art approaches are inadequate for at least one of the reasons described above.

SUMMARY

In general, embodiments of the invention provide an approach for interconnect formation in a semiconductor device. Specifically, a Cu layer is removed to a top surface of an Ru layer using CMP, the Cu layer is removed to form a recess within each of a plurality of trenches of a dielectric of the semiconductor device, and the Ru layer is removed using an etch process (e.g., a wet etch). An additional CMP is performed to reach the desired target trench height and to planarize the wafer.

One aspect of the present invention includes a method for forming a device, the method comprising: providing an integrated circuit (IC) structure comprising: a dielectric layer formed over a substrate, the dielectric layer having a plurality of trenches formed therein; a first liner layer formed over the dielectric layer; a ruthenium (Ru) layer formed over the first liner layer; and a copper (Cu) layer formed over the Ru layer; removing the Cu layer to a top surface of the Ru layer; removing the Cu layer to form a recess within each of the plurality of trenches; etching the Ru layer; and planarizing the IC structure.

Another aspect of the present invention includes a method for interconnect formation, the method comprising: providing an integrated circuit (IC) structure comprising: a dielectric layer formed over a substrate, the dielectric layer having a plurality of trenches formed therein; a first liner layer formed over the dielectric layer; a ruthenium (Ru) layer formed over the first liner layer; and a copper (Cu) layer formed over the Ru layer; removing the Cu layer to a top surface of the Ru layer; removing the Cu layer to form a recess within each of the plurality of trenches; etching the Ru layer over the first liner layer and within the recess of each of the plurality of trenches; and planarizing the IC structure.

Another aspect of the present invention provides a method for Back-End-Of-Line interconnect formation, the method comprising: providing an integrated circuit (IC) structure comprising: an ultra-low-k (ULK) dielectric layer formed over a substrate, the ULK dielectric layer having a plurality of trenches formed therein; a first liner layer formed over the ULK dielectric layer; a ruthenium (Ru) layer formed over the first liner layer; and a copper (Cu) layer formed over the Ru layer; removing the Cu layer to a top surface of the Ru layer using chemical mechanical planarization (CMP); removing the Cu layer to form a recess within each of the plurality of trenches; etching the Ru layer over the first liner layer and within the recess of each of the plurality of trenches; and planarizing the IC structure.

BRIEF DESCRIPTION OF THE DRAWINGS

These and other features of this invention will be more readily understood from the following detailed description of the various aspects of the invention taken in conjunction with the accompanying drawings in which.

Figure 1:
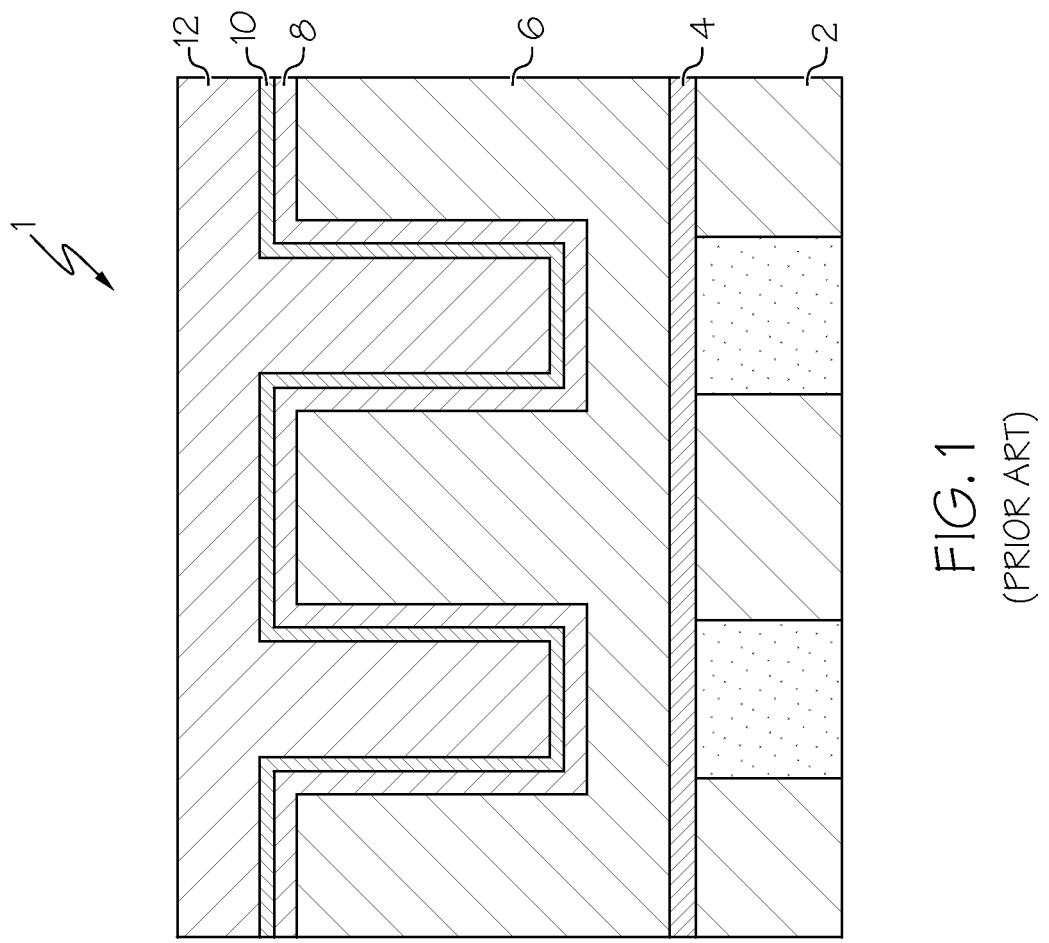
FIG. 1 shows a cross-sectional view of a prior art semiconductor device following formation of a Ta/TaN layer, a Ru layer, and a Cu layer.
Figure 2:
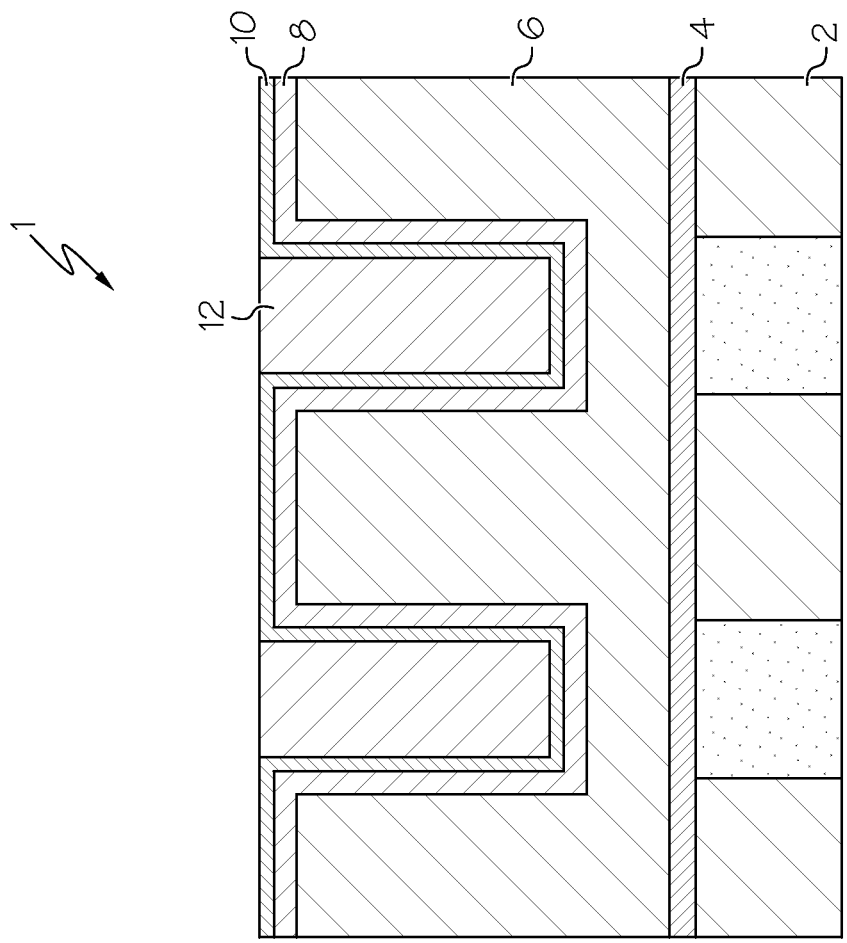
FIG. 2 shows a cross-sectional view of the prior art semiconductor device of FIG. 1 following CMP of the Cu layer.
Figure 3:
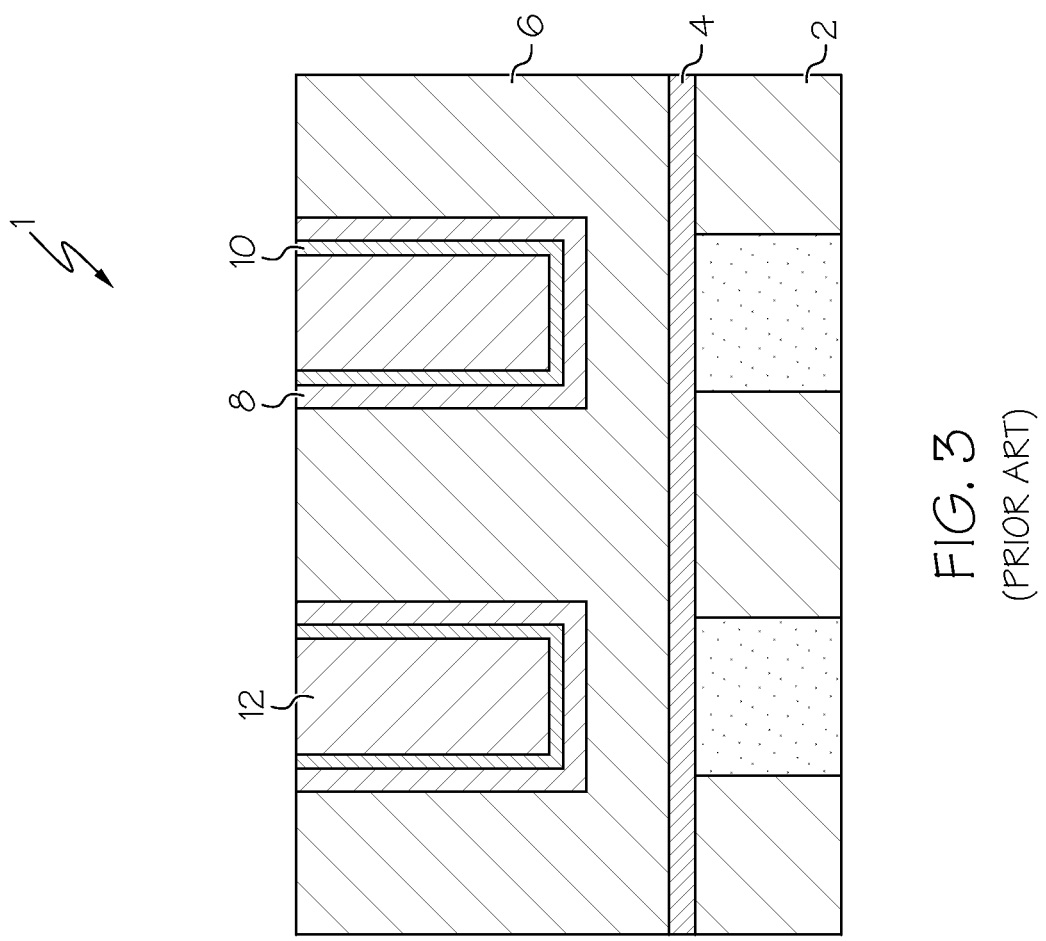
FIG. 3 shows a cross-sectional view of the prior art device of FIG. 2 following CMP of the Ta/TaN layer, the Ru layer, and the Cu layer.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are methods and techniques used in interconnect processing of integrated circuits and other devices. Specifically, a Cu layer is removed to a top surface of an Ru layer using CMP, the Cu layer is removed to form a recess within each of a plurality of trenches of a dielectric of the semiconductor device, and the Ru layer is removed using an etch process (e.g., a wet etch). An additional CMP is performed to reach the desired target trench height and to planarize the wafer.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

Figure 4:
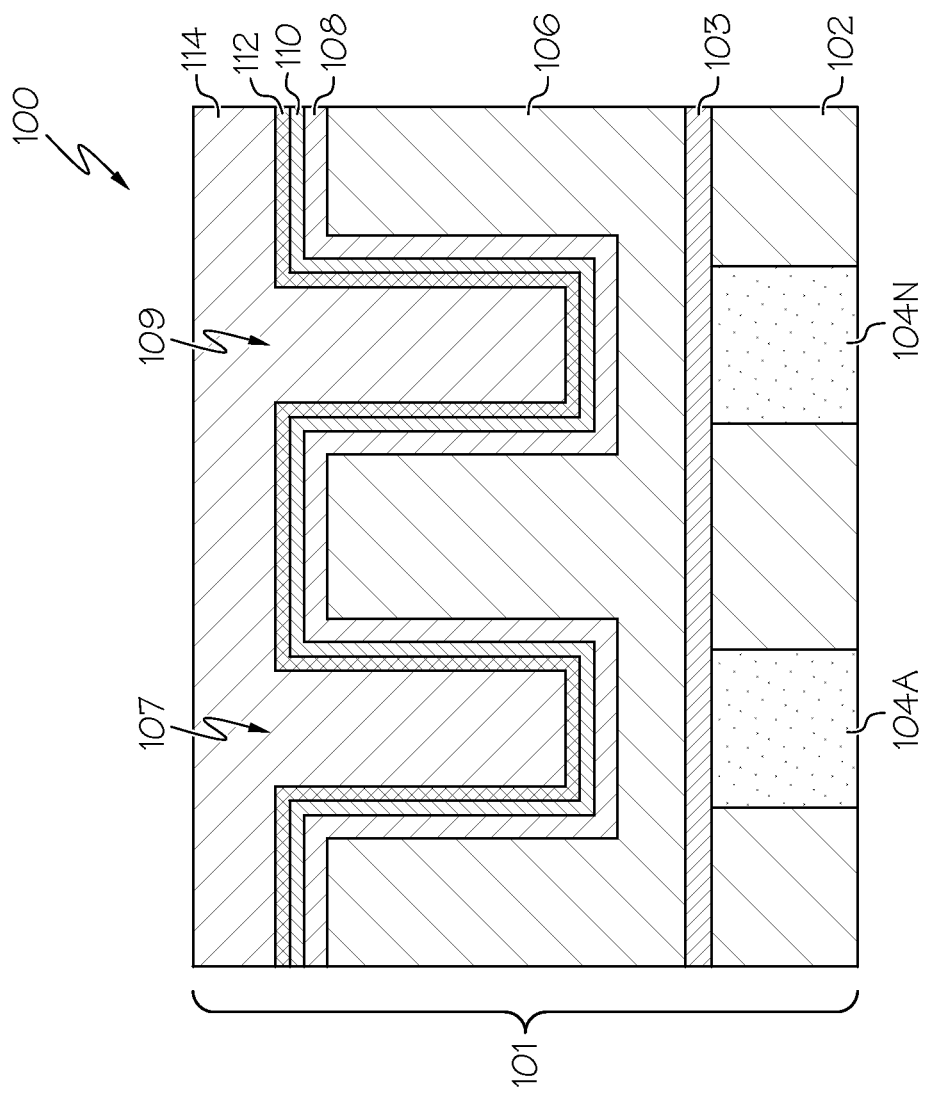
FIG. 4 shows a cross-sectional view of a device following formation of a TaN layer, a Ta layer, a Ru layer, and a Cu layer according to an illustrative embodiment.

With reference again to the figures, FIG. 4 shows a cross section of a device 100 according to illustrative embodiments. Device 100 comprises an IC structure 101 including a substrate 102, in which metal lines 104A-N are formed. A capping layer 103 (e.g., nitrogen-doped silicon carbide or $SiN_xC_yH_z$ (NBLoK) is formed over substrate 102. A dielectric layer (e.g., an ultra-low-k dielectric material) 106 is formed on capping layer 103, dielectric layer 106 having a plurality of trenches 107 and 109 formed therein. As shown, a first liner layer 108 is formed on dielectric layer 106, a second liner layer 110 is formed over first liner layer 108, a Ru layer 112 is formed over second liner layer 110, and a Cu layer 114 is formed over Ru layer 112. In an exemplary embodiment, first liner layer 108 comprises TaN, and second liner layer 110 comprises Ta. It will be appreciated that IC structure 101 may comprise additional or fewer layers in alternative embodiments without departing from the spirit and scope of the invention.

IC structure 101 may be formed, for example, in a lithographic stepper including multiple spin coating stations and at least one curing chamber so that the materials of IC structure 101 may be formed within the lithographic stepper in a single processing step. Alternately, multiple lithographic steppers and/or dedicated curing tools may be employed to form IC structure 101.

Substrate 102 may be any silicon containing substrate including, but not limited to Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment, when substrate 102 is a silicon-on-insulator (SOI) or SiGe-on-insulator (SGOI) substrate, the thickness of the semiconducting Si-containing layer atop the buried insulating layer (not shown) may be 10 nm or greater. In one embodiment, the SOI or SGOI substrate may be fabricated using a thermal bonding process, or alternatively be fabricated by an ion implantation process, such as separation by ion implantation of oxygen (SIMOX).

In exemplary embodiments, dielectric layer 106 is preferably an ultra-low-k (ULK) dielectric, i.e., a dielectric material having a dielectric constant lower than 3.9, which is the dielectric constant of silicon dioxide ($SiO_2$). The low-k or ULK dielectric material may be deposited by chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes include, but are not limited to: Atomic layer deposition, Atmospheric Pressure CVD (APCVD), Low Pressure CVD (LPCVD), Plasma Enhanced CVD (EPCVD), Metal-Organic CVD (MOCVD) and combinations thereof. Furthermore, the low-k dielectric material may also be deposited using a conformal deposition method.

Figure 5:
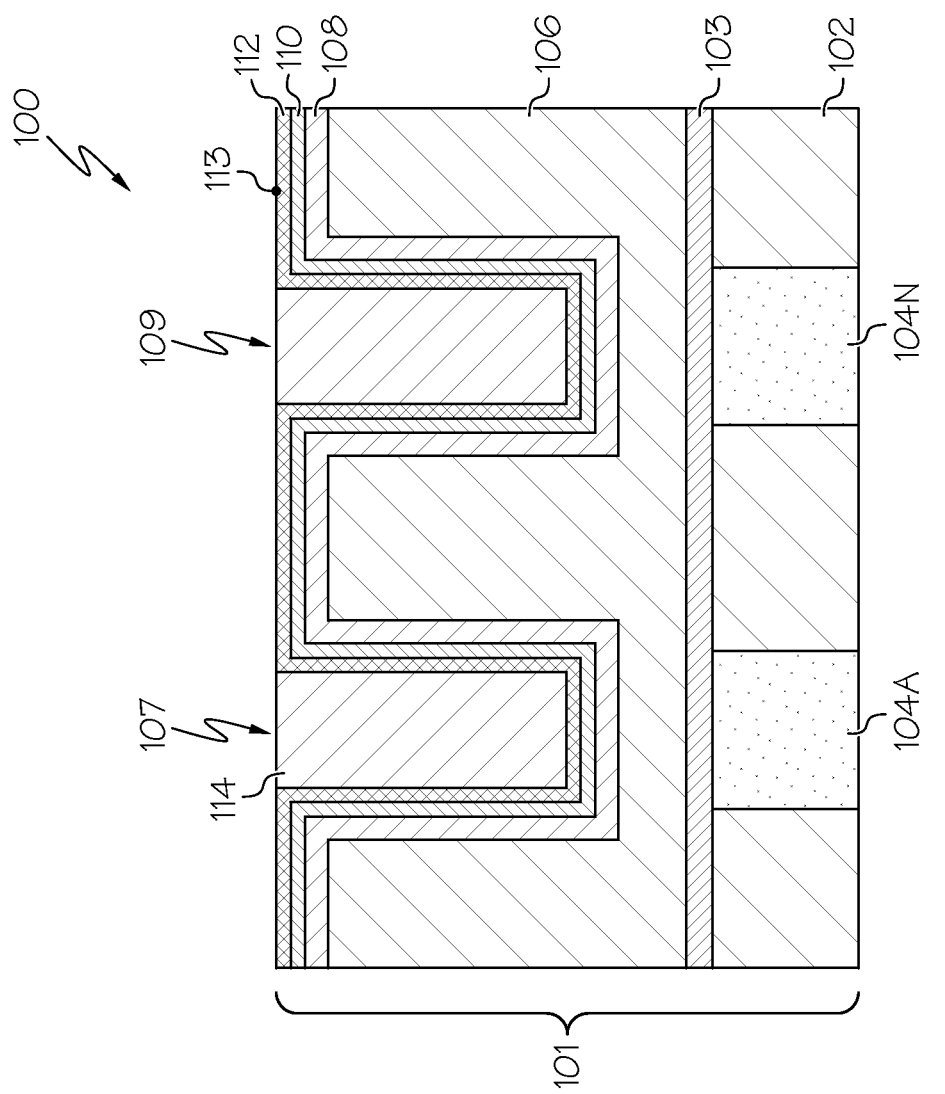
FIG. 5 shows a cross-sectional view of the device following a CMP to a top surface of the Ru layer according to an illustrative embodiment.

As shown in FIG. 5, during processing, Cu layer 114 is removed to a top surface 113 of Ru layer 112 using CMP. In this step, the bulk Cu polishing eliminates Cu layer 114 using a slurry with high removal selectivity of Cu to Ru layer 112.

Figure 6:
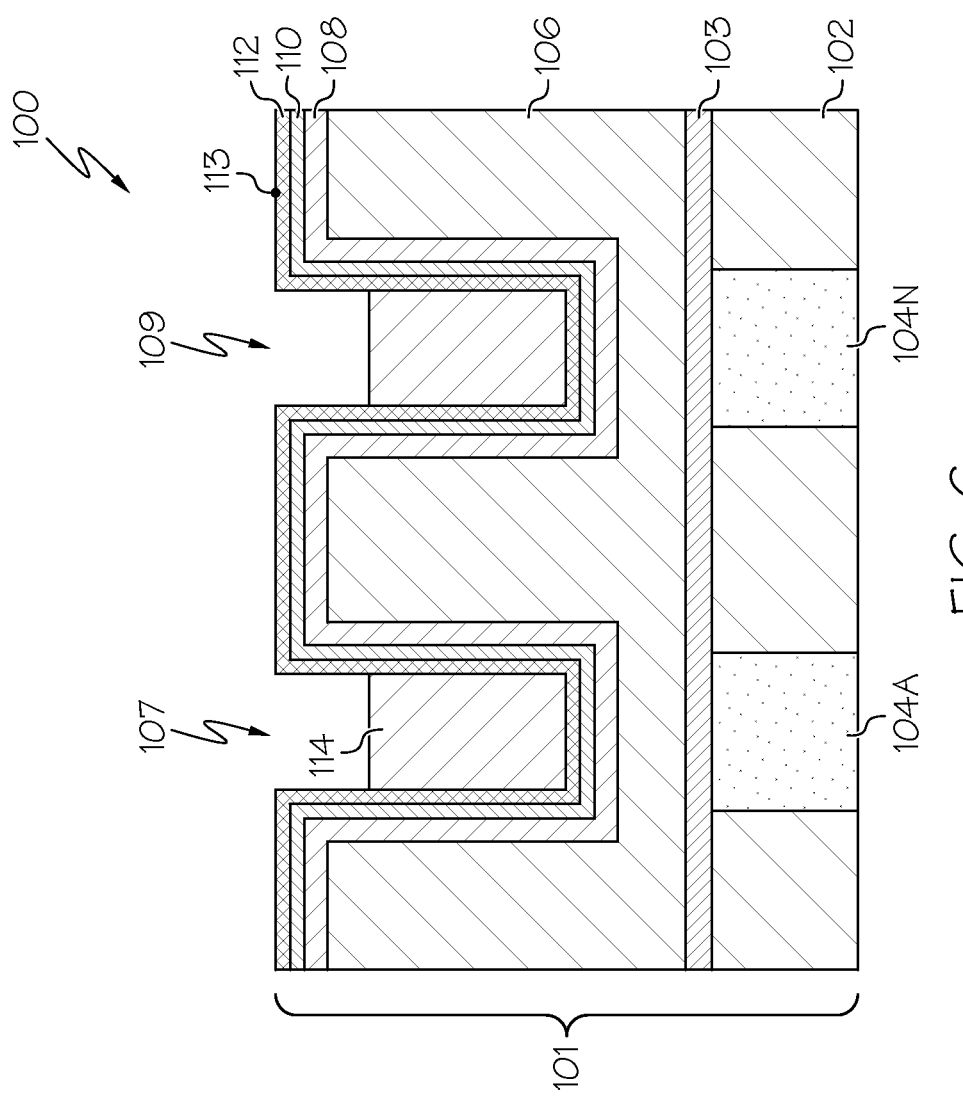
FIG. 6 shows a cross-sectional view of the device following removal of the Cu layer to form of a recess within each trench of the device according to an illustrative embodiment.

As shown in FIG. 6, Cu layer 114 is further removed to form a recess within each of plurality of trenches 107 and 109. In an exemplary embodiment, Cu layer 114 may be removed using a Standard Clean 1 (SC1) chemistry or DHF. Standard Clean 1 (SC1) is a chemical combination consisting of ammonium hydroxide ($NH_4 OH$), peroxide ($H_2 O_2$) and water ($H_2 O$). A SC1 cleaning cycle is designed to promote oxidation and dissolution of organic impurities on the substrates in the solution of $NH_4 OH$, $H_2 O_2$ and $H_2 O$ at a temperature of approximately 75° C. to 80° C. With DHF, the silicon wafer is placed inside a dilute hydrofluoric acid (DHF) bath so that sacrificial oxide above the wafer is removed. Then, the wafer is transferred to an overflow (OF) bath to remove any residual DHF acid on the wafer. Thereafter, the wafer is washed inside an RCA1 cleaning bath using a RCA1 solution. The RCA1 solution is a mixture containing ammonium hydroxide ($NH_4 OH$), de-onized water (HDIW) and hydrogen peroxide ($H_2 O_2$). The RCA1 solution is heated to about 40° C. to 70° C. to remove organic particles from the surface of the wafer.

Figure 7:
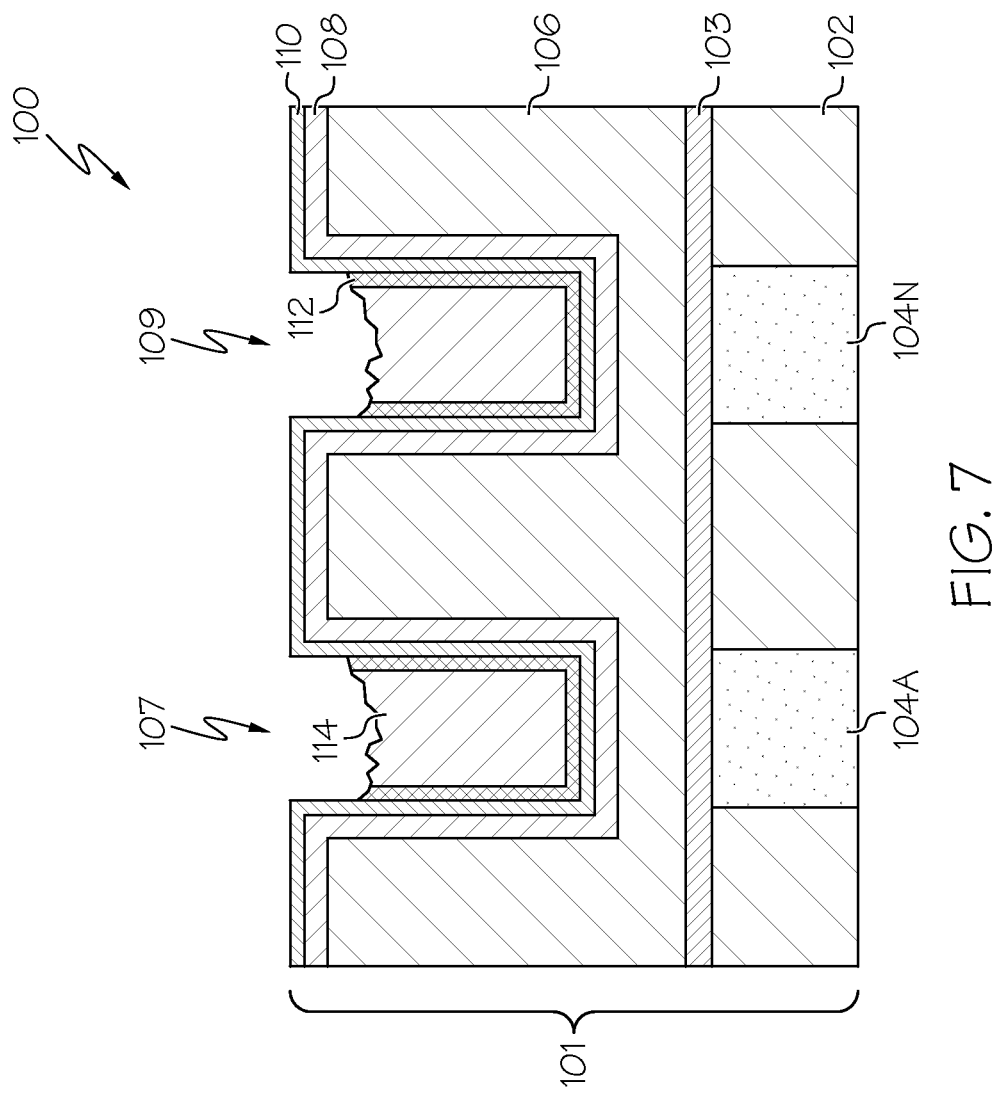
FIG. 7 shows a cross-sectional view of the device following an etch of the Ru layer according to an illustrative embodiment.

Next, as shown in FIG. 7, Ru layer 112 is etched. In an exemplary embodiment, Ru layer 112 atop second liner layer 110, and exposed by the recess in trenches 107 and 109 is removed using a wet etch process. For example, a Ru selective wet etch is performed electrochemically using a mixed liquid (e.g., containing approximately 0.1-0.5% Hydrogen Chlorine (HCl)). In this scheme the desired wet etchant will have no or very low etch rate for the second liner layer 110 (e.g., Ta). However, some etching of Cu layer 114 is also possible, as shown by the rough and non-uniform recessed surface topography of Cu within trenches 107 and 109.

Figure 8:
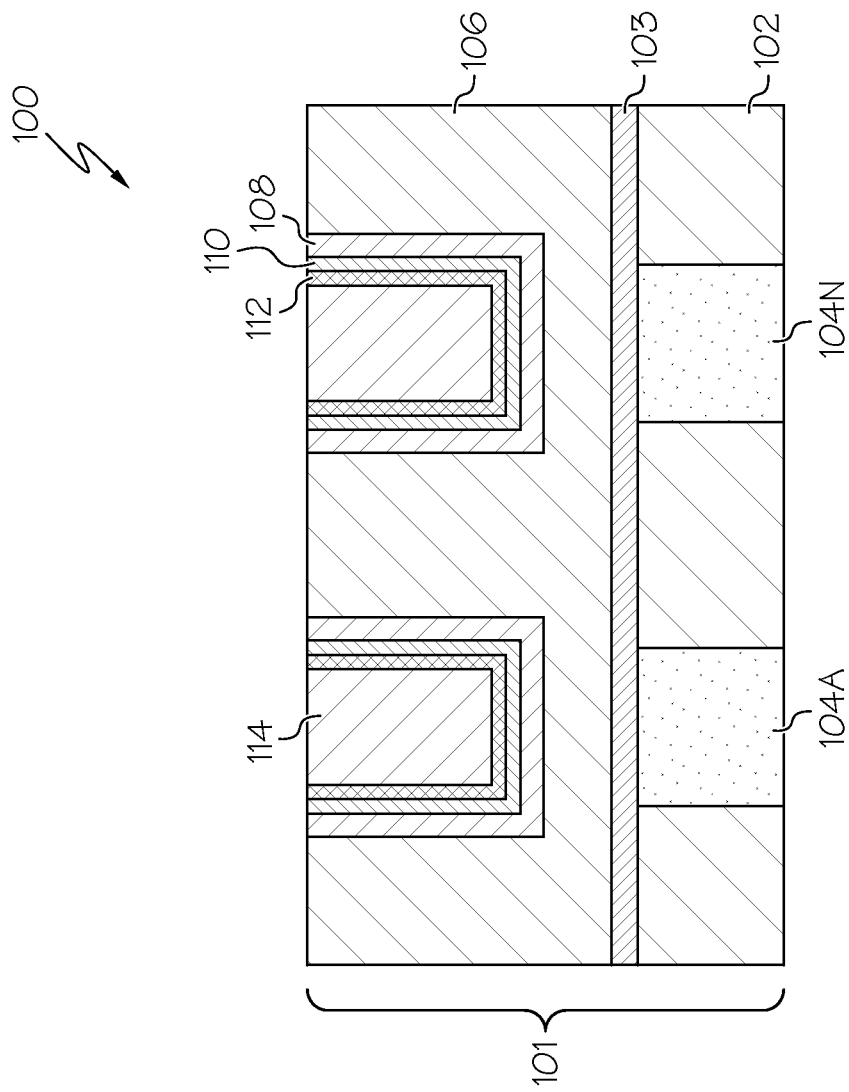
FIG. 8 shows a cross-sectional view of the device following a CMP according to an illustrative embodiment.

Next, as shown in FIG. 8, another CMP is performed to reach the target trench height for IC structure 101. Here, the CMP removes portions of dielectric layer 106, first liner layer 108, second liner layer 110, Ru layer 112 and Cu layer 114. A wide variety of slurries may be used to clear this material, and an optional post-CMP cleaning can be performed for increased results.

Figure 9:
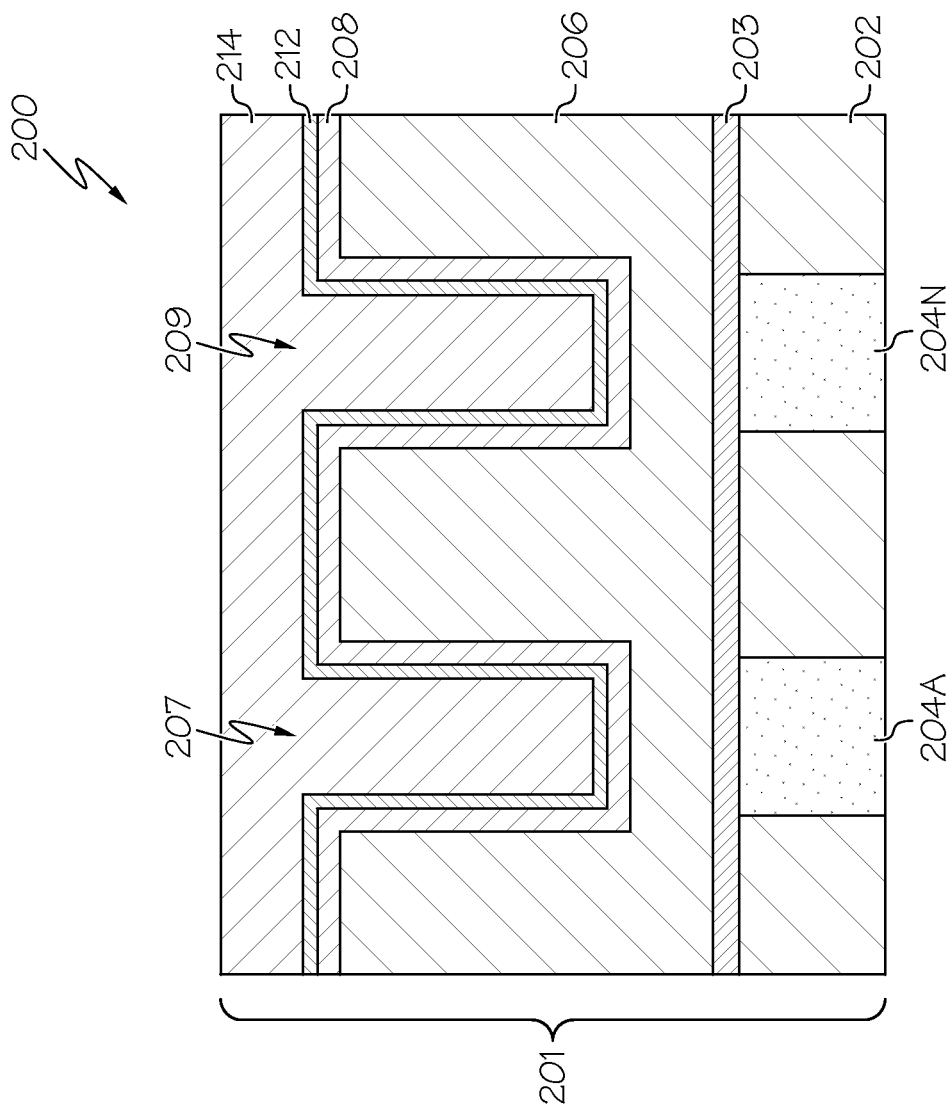
FIG. 9 shows a cross-sectional view of a device following formation of a TaN layer, a Ru layer, and a Cu layer according to another illustrative embodiment.

Turning now to FIG. 9, another exemplary embodiment will be shown and described in greater detail. Device 200 comprises an IC structure 201 including a substrate 202, in which metal lines 204A-N are formed. A capping layer 203 (e.g., nitrogen-doped silicon carbide or $SiN_xC_yH_z$ (NBLoK)) is formed over substrate 202. A dielectric layer (e.g., an ultra-low-k dielectric material) 206 is formed on capping layer 203, dielectric layer 206 having a plurality of trenches 207 and 209 formed therein. As shown, a first liner layer 208 is formed on dielectric layer 206, a Ru layer 212 is formed over first liner layer 208, and a Cu layer 214 is formed over Ru layer 212. In an exemplary embodiment, first liner layer 208 comprises TaN. It will be appreciated that IC structure 201 may comprise additional or fewer layers in alternative embodiments without departing from the spirit and scope of the invention.

Figure 10:
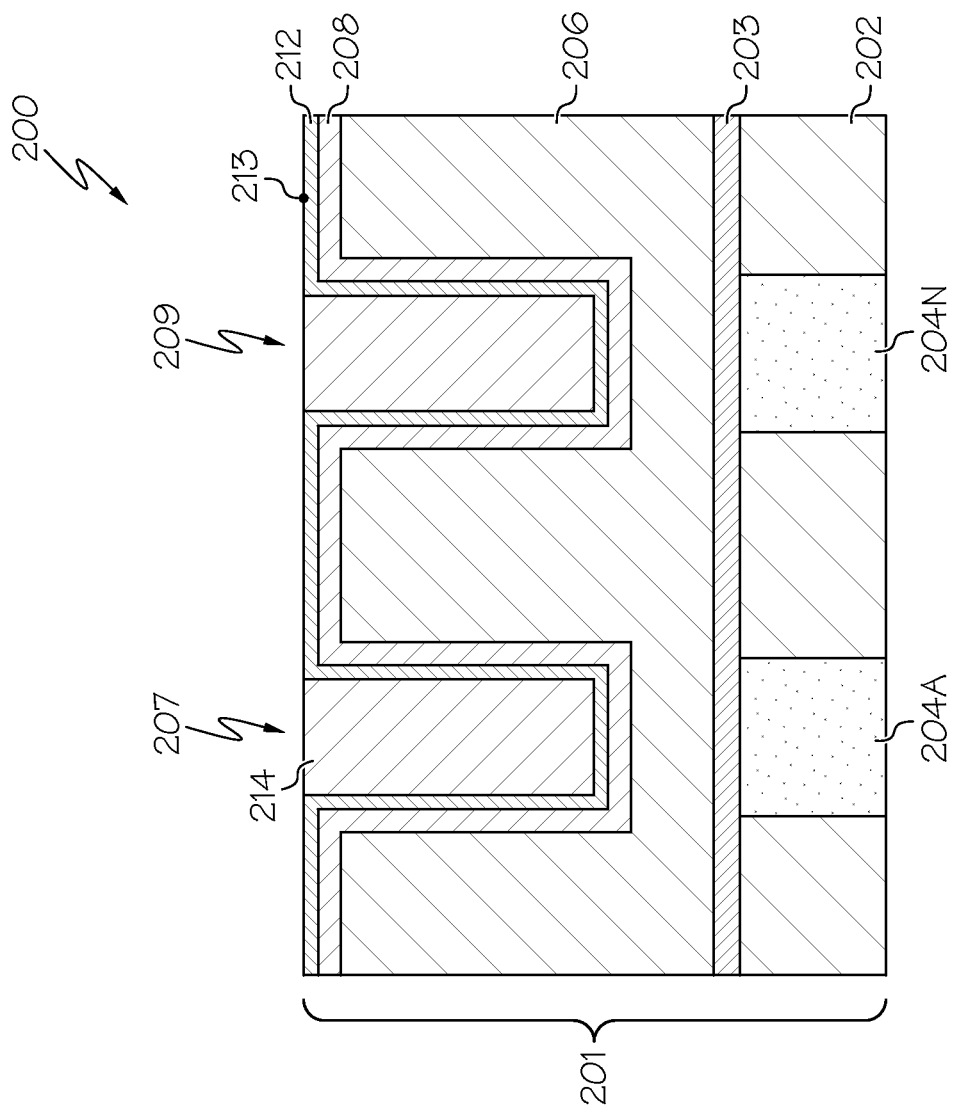
FIG. 10 shows a cross-sectional view of the device following a CMP to a top surface of the Ru layer according to another illustrative embodiment.

As shown in FIG. 10, during processing, Cu layer 114 is removed to a top surface 213 of Ru layer 212 using CMP. In this step, the bulk Cu polishing eliminates Cu layer 214 using a slurry with high removal selectivity of Cu to Ru layer 212.

Figure 11:
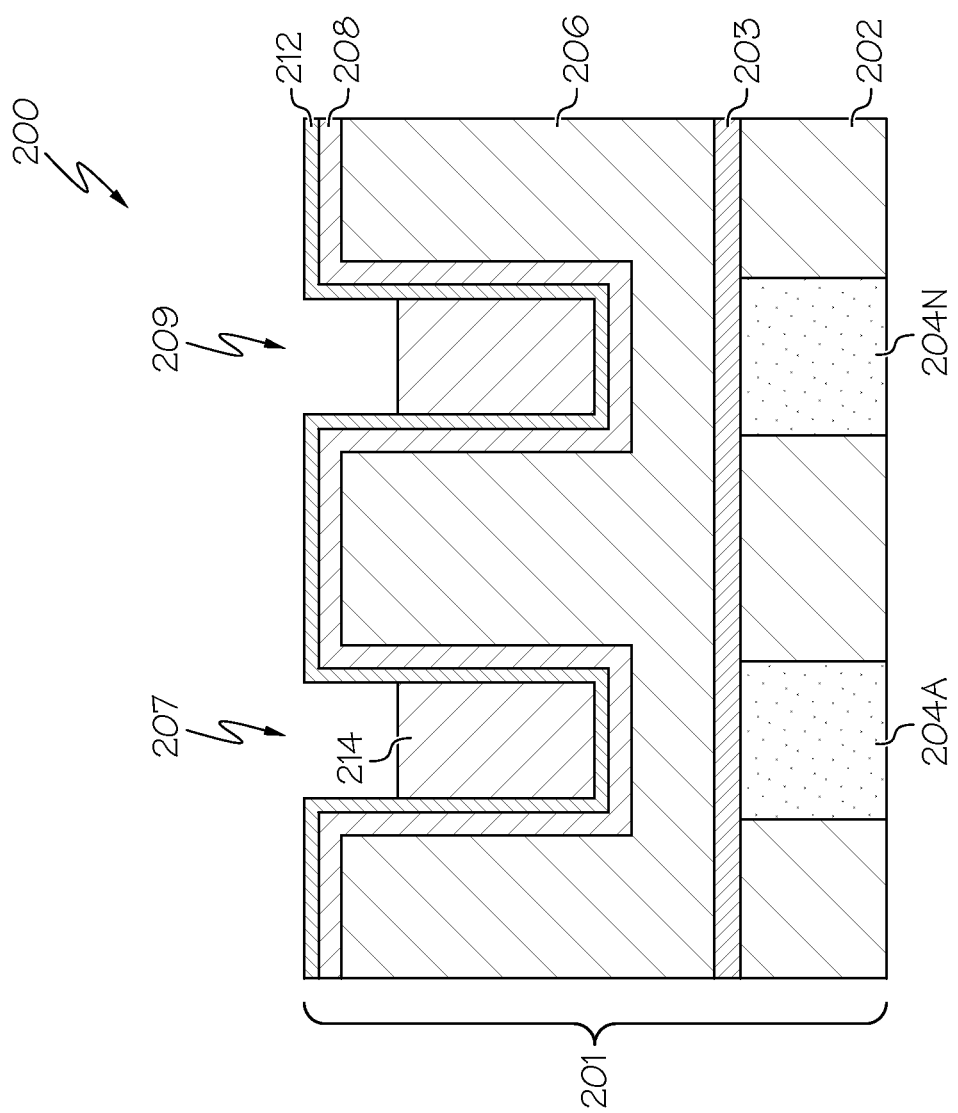
FIG. 11 shows a cross-sectional view of the device following removal of the Cu layer to form of a recess within each trench of the device according to another illustrative embodiment.

As shown in FIG. 11, Cu layer 214 is further removed to form a recess within each of plurality of trenches 207 and 209. In an exemplary embodiment, Cu layer 214 can be removed using a Standard Clean 1 (SC1) chemistry or DHF.

Figure 12:
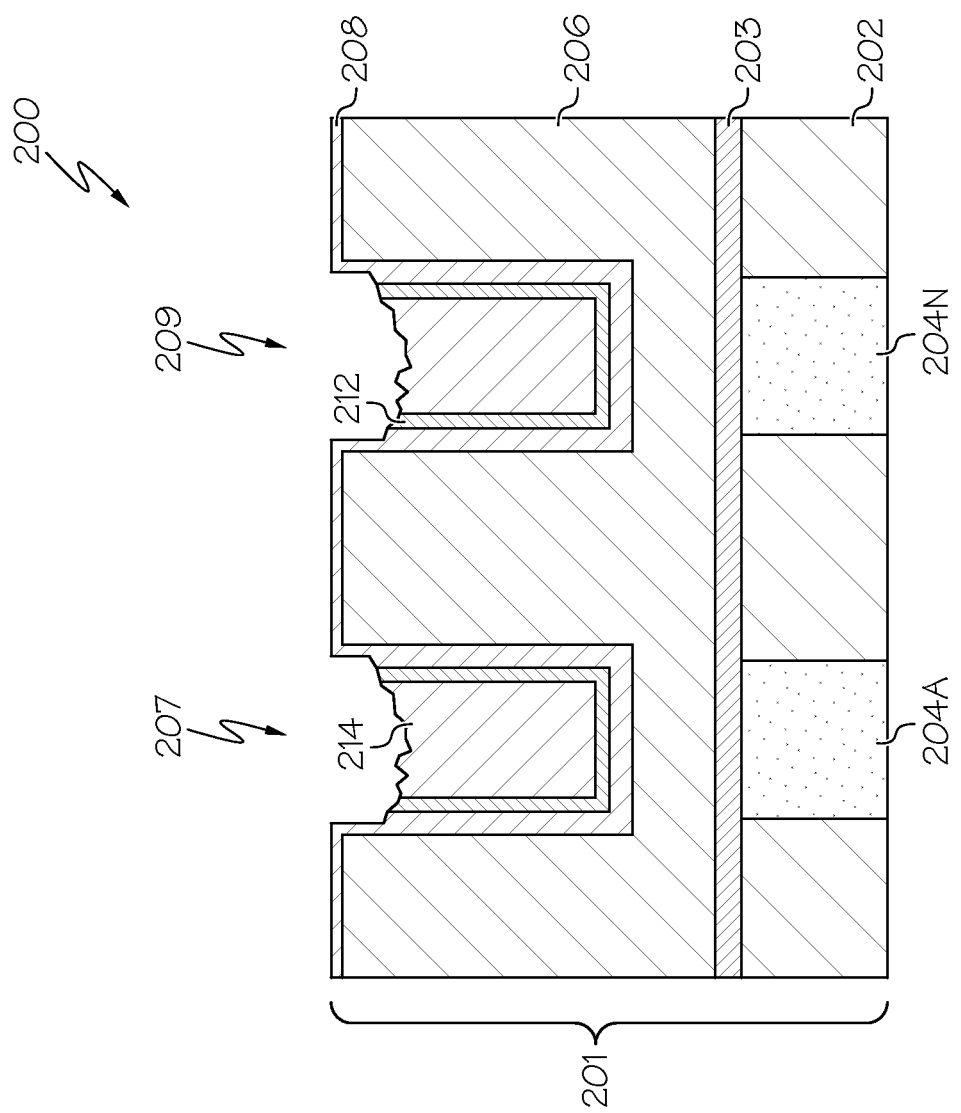
FIG. 12 shows a cross-sectional view of the device following an etch of the Ru layer according to another illustrative embodiment.

Next, as shown in FIG. 12, Ru layer 212 is etched. In an exemplary embodiment, Ru layer 212 atop second liner layer 210, and exposed by the recesses in trenches 207 and 209, is removed using a wet etch process. For example, a Ru selective wet etch may be performed electrochemically using a mixed liquid (e.g., containing approximately 0.1-0.5% Hydrogen Chlorine (HCl)). Some etching of Cu layer 214 is possible, as shown by the rough and non-uniform recessed surface topography of Cu within trenches 207 and 209. First liner layer 208 (e.g., TaN) can also be partially etched at this concentration. However, it'll be appreciated that the etch rate can be varied in alternative embodiments.

Figure 13:
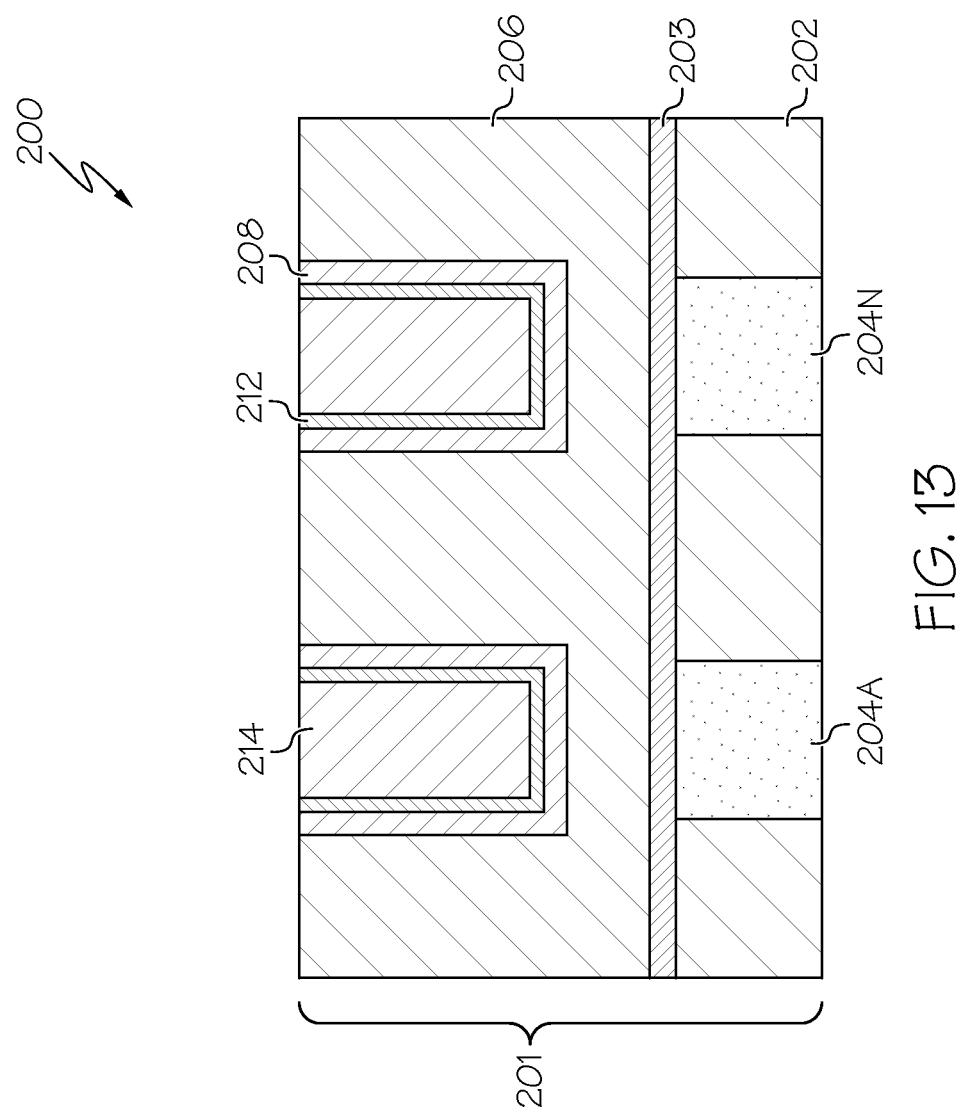
FIG. 13 shows a cross-sectional view of the device following a CMP according to another illustrative embodiment.

Next, as shown in FIG. 13, another CMP is performed to reach the target trench height of IC structure 201. Here, the CMP removes portions of dielectric layer 206, first liner layer 208, Ru layer 212 and Cu layer 214. A wide variety of slurries may be used to clear this material, and an optional post-CMP cleaning can be performed for increased results.

Furthermore, in various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for interconnect formation in a semiconductor device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
   providing a semiconductor structure comprising:
      a dielectric layer formed over a substrate, the dielectric layer having a plurality of trenches formed therein;
      a first liner layer formed over the dielectric layer;
      a ruthenium (Ru) layer formed over the first liner layer; and
      a copper (Cu) layer formed over the Ru layer, wherein at least a portion of the dielectric layer, at least a portion of the first liner layer, and at least a portion of the Ru layer are disposed between each portion of the Cu layer and the substrate;
   removing the Cu layer to a top surface of the Ru layer;
   removing the Cu layer to form a recess within each of the plurality of trenches;
   etching the Ru layer over the first liner layer and within the recess of each of the plurality of trenches; and
   planarizing the semiconductor structure.

2. The method according to claim 1, the providing the IC structure further comprising a second liner layer formed over the first liner layer.

3. The method according to claim 2, the second liner layer comprising tantalum.

4. The method according to claim 1, the first liner layer comprising tantalum nitride.

5. The method according to claim 1, the etching the Ru layer comprising performing a wet etch.

6. The method according to claim 1, the planarizing the semiconductor structure comprising performing a chemical mechanical planarization (CMP) of the dielectric layer, the first liner layer, and the Ru layer.

7. The method according to claim 1, the planarizing the IC structure comprising performing a CMP of the dielectric layer, the first liner layer, the second liner layer, and the Ru layer.

8. A method for interconnect formation, the method comprising:
   providing an integrated circuit (IC) structure comprising:
      a dielectric layer formed over a substrate, the dielectric layer having a plurality of trenches formed therein;
      a first liner layer formed over the dielectric layer;
      a ruthenium (Ru) layer formed over the first liner layer; and
      a copper (Cu) layer formed over the Ru layer, wherein at least a portion of the dielectric layer, at least a portion of the first liner layer, and at least a portion of the Ru layer are disposed between each portion of the Cu layer and the substrate;
   removing the Cu layer to a top surface of the Ru layer;
   removing the Cu layer to form a recess within each of the plurality of trenches;
   etching the Ru layer over the first liner layer and within the recess of each of the plurality of trenches; and
   planarizing the IC structure.

9. The method according to claim 8, the providing the IC structure further comprising a second liner layer formed over the first liner layer.

10. The method according to claim 9, the planarizing the IC structure comprising performing a CMP of the dielectric layer, the first liner layer, the second liner layer, and the Ru layer.

11. The method according to claim 8, the first liner layer comprising tantalum nitride, and the second liner layer comprising tantalum.

12. The method according to claim 8, the etching the Ru layer comprising performing a wet etch.

13. The method according to claim 8, the planarizing the IC structure comprising performing a chemical mechanical planarization (CMP) of the dielectric layer, the first liner layer, and the Ru layer.

14. The method according to claim 8, the removing the Cu layer to a top surface of the Ru layer comprising performing chemical mechanical planarization.

15. A method for Back-End-Of-Line interconnect formation, the method comprising:
   providing an integrated circuit (IC) structure comprising:
      an ultra-low-k (ULK) dielectric layer formed over a substrate, the ULK dielectric layer having a plurality of trenches formed therein;
      a first liner layer formed over the ULK dielectric layer;
      a ruthenium (Ru) layer formed over the first liner layer; and
      a copper (Cu) layer formed over the Ru layer, wherein at least a portion of the dielectric layer, at least a portion of the first liner layer, and at least a portion of the Ru layer are disposed between each portion of the Cu layer and the substrate;
   removing the Cu layer to a top surface of the Ru layer by chemical mechanical planarization (CMP);
   removing the Cu layer to form a recess within each of the plurality of trenches;
   etching the Ru layer over the first liner layer and within the recess of each of the plurality of trenches; and
   planarizing the IC structure.

16. The method according to claim 15, the providing the IC structure further comprising a second liner layer formed over the first liner layer.

17. The method according to claim 16, the planarizing the IC structure comprising performing a CMP of the dielectric layer, the first liner layer, the second liner layer, and the Ru layer.

18. The method according to claim 15, the first liner layer comprising tantalum nitride, and the second liner layer comprising tantalum.

19. The method according to claim 15, the etching the Ru layer comprising performing a wet etch.

20. The method according to claim 15, the planarizing the IC structure comprising performing a CMP of the dielectric layer, the first liner layer, and the Ru layer.

* * * * *